(12) United States Patent
Shimada

(10) Patent No.: US 7,473,013 B2
(45) Date of Patent: Jan. 6, 2009

(54) INDICATOR LAMP HAVING A CONVERGING LENS

(75) Inventor: Toshio Shimada, Nagano (JP)

(73) Assignee: Okaya Electric Industries Co., Ltd., Tokyo (JP)

( * ) Notice: Subject to any disclaimer, the term of this patent is extended or adjusted under 35 U.S.C. 154(b) by 172 days.

(21) Appl. No.: 10/595,094

(22) PCT Filed: Dec. 6, 2004

(86) PCT No.: PCT/JP2004/018518

§ 371 (c)(1), (2), (4) Date: Feb. 9, 2006

(87) PCT Pub. No.: WO2005/057082

PCT Pub. Date: Jun. 23, 2005

(65) Prior Publication Data

US 2006/0291245 A1    Dec. 28, 2006

(30) Foreign Application Priority Data

Dec. 10, 2003  (JP) .............................. 2003-411913
Feb. 13, 2004  (JP) .............................. 2004-036824
Mar. 22, 2004  (JP) .............................. 2004-082559

(51) Int. Cl.
*F21V 5/04* (2006.01)

(52) U.S. Cl. ........................ 362/327; 362/296; 362/307; 362/329; 362/347; 362/360; 362/800; 257/98; 313/512

(58) Field of Classification Search ................. 362/327, 362/555, 296, 306–308, 329, 341, 347, 350, 362/351, 360, 361, 331–334, 349; 257/98
See application file for complete search history.

(56) References Cited

U.S. PATENT DOCUMENTS 5,043,716 A * 8/1991 Latz et al. ..................... 345/82
5,757,557 A * 5/1998 Medvedev et al. .......... 359/708

(Continued)

FOREIGN PATENT DOCUMENTS

JP              360610         12/1956

(Continued)

*Primary Examiner*—Jong-Suk (James) Lee
*Assistant Examiner*—Leah S Lovell
(74) *Attorney, Agent, or Firm*—Wenderoth, Lind & Ponack, L.L.P.

(57) ABSTRACT

It is sought to provide an indicator lamp, which is excellent not only in short distance visual recognition property but also in long distance one, as well as being further excellent in sight field angle property.

An indicator lamp includes a light-emitting element 1 and a light-emitting element lens 2 having a light-emitting element mounting cavity 3 formed at the bottom, in which the light-emitting element disposed in the cavity 3 emits light to be fully reflected by the peripheral surface of the lens 1 and proceeds as emission light flux forwardly of the lens 1. The slope angle of the peripheral surface with respect to the lens axis is reduced progressively from the bottom toward the lens front surface 5 in three stages, thus forming circumferential corners 7 and 8 as boundaries between adjacent ones of the three stages. The circumferential corners scatter light emitted from the light emitting element 2 to provide concentric emission light fluxes as viewed from the side of the lens front.

6 Claims, 7 Drawing Sheets

U.S. PATENT DOCUMENTS

| | | | | |
|---|---|---|---|---|
| 5,926,320 A * | 7/1999 | Parkyn et al. | ................ | 359/641 |
| 6,547,423 B2 * | 4/2003 | Marshall et al. | ............. | 362/333 |
| 6,560,038 B1 * | 5/2003 | Parkyn et al. | ................ | 359/726 |
| 6,724,543 B1 * | 4/2004 | Chinniah et al. | ............ | 359/718 |
| 6,746,295 B2 * | 6/2004 | Sorg | ............................ | 445/24 |
| 6,755,556 B2 * | 6/2004 | Gasquet et al. | ............. | 362/329 |
| 6,953,271 B2 * | 10/2005 | Aynie et al. | ................. | 362/511 |
| 7,098,485 B2 * | 8/2006 | Isokawa | ...................... | 257/98 |
| 7,111,964 B2 * | 9/2006 | Suehiro et al. | .............. | 362/328 |
| 7,329,029 B2 * | 2/2008 | Chaves et al. | ................ | 362/329 |
| 2004/0190304 A1 * | 9/2004 | Sugimoto et al. | ........... | 362/555 |

FOREIGN PATENT DOCUMENTS

| | | |
|---|---|---|
| JP | 52-7580 | 1/1977 |
| JP | 61-1066 | 1/1986 |
| JP | 6-28725 | 8/1994 |
| JP | 8-107235 | 4/1996 |
| JP | 2003-263907 | 9/2003 |

* cited by examiner

INDICATOR LAMP HAVING A CONVERGING LENS

BACKGROUND OF THE INVENTION

1. Field of the Invention

This invention relates to an indicator lamp comprising a light-emitting element such as a LED (light-emitting diode) and a chip and a converging lens disposed atop and covering the light-emitting element to converge light emitted from the element and, more particularly, to an indicator lamp, which permits a small-size light-emitting element to emit light appropriately in a broad light-emission area and with good efficiency.

2. Prior Art

The light emission zone of a light-emitting element such as a LED is intrinsically a pin-point. Such pin-point light emission lacks directivity and is scattered. It is thus impossible to form a substantially fixed planar light-emission area. Besides, the long distance visual recognition property is deteriorated. Accordingly, a converging lens is usually disposed, which covers the front of the light-emitting element and converges the emitted light.

An indicator lamp using such a lens is well-known in Japanese Utility Model Publication H6-28725. This converging lens has a light-emitting element mounting cavity formed at its bottom, and its peripheral surface which is parabolic in shape from the bottom toward the front, fully reflects light emitted from the light-emitting element such that the reflected light proceeds forwards.

The above light-emitting element lens indeed converges light emitted from the light-emitting element such that the converged light proceeds straight forward as emission light flux with suppression of the scattering of light, thus ensuring excellent long distance visual recognition property. However, since the scattering of light is suppressed, a problem is posed in that the visual field angle as visual range is reduced. Particularly, when the indicator lamp is used as an indicator device, a broad visual field angle is important as well as the long distance visual recognition property.

Besides, the prior art light-emitting element lens has a structure that the lens front is formed with a deep ring-like groove such as to form a convex part at the lens front center. The forming of a lens having such a complicated structure encounters great difficulty. Particularly, in the case of a lens body having a certain height, the ring-like groove may become too deep, and depending on the size and material of the lens, light emitted from the light-emitting element may not always smoothly and efficiently proceed as emission light flux forwards.

To solve the problems as discussed above, it is a primary object of the invention to provide an indicator lamp, which is excellent not only in the short distance visual recognition property but also in the long distance one as well as being further excellent in the visual field angle property.

A second object of the invention is to provide an indicator lamp, which permits, without lens shape complication, light emitted from the light-emitting element to smoothly and efficiently proceed as emission light flux forwards.

SUMMARY OF THE INVENTION

To attain the above objects of the invention, an indicator lamp is provided, which comprises a light-emitting element and a light-emitting element lens, the light-emitting element lens being constituted by a lens body formed at the bottom thereof with a light-emitting element mounting cavity, the light-emitting element being mounted therein, the lens body having an inverted conical shape peripheral surface for fully reflecting and re-directing light emitted from the light-emitting element, the peripheral surface having varying angles with respect to the lens axis from the bottom toward the front of the lens, thereby forming one or more circumferential corners, which scatter light emitted from the light-emitting element to provide concentric emission light fluxes as viewed from the side of the lens front.

The lens body has a convex lens part projecting from the center of the lens front.

The lens body has a convex lens part projecting from the center of the lens front and also has an annular ridge of a semi-circular sectional profile also projecting from the lens front such as to surround the convex lens part.

Another indicator lamp which is provided comprises a light-emitting element and a lens body with the diameter thereof increasing as one goes forwardly, the light-emitting element being disposed at the bottom of the lens body and emitting light to be fully reflected by the peripheral surface of the lens body and proceed forwardly thereof, the lens body being formed at the bottom thereof with a substantially cylindrical cavity accommodating the light-emitting element, light emitted from the light-emitting element such as to be directed toward the peripheral surface of the cavity being incident on the lens body at angles less than the full reflection angle corresponding to the refractive index of the lens body, passing through the lens body, and being incident on the peripheral surface of the lens body to be fully reflected and proceed forwardly of the lens body, light emitted from the light-emitting element such as to be directed toward the front surface of the cavity being incident on the lens body at angles less than the full reflection angle and passing through the lens body to directly proceed forwardly of the lens body.

The front center of the lens body has a convex lens part projecting forwardly of the lens body and also a flat surface part extending around the convex lens part, light emitted from the light-emitting element such as to be directed toward the front surface of the cavity being incident on the lens at angles less than the full reflection angle of the lens body, passing through the lens body, and being converged by the convex lens part to proceed forwardly of the lens body, light emitted from the light-emitting element such as to be directed toward the peripheral surface of the cavity being incident on the lens body at angles less than the full reflection angle of the lens body to be fully reflected and proceed forwardly from the flat surface part.

A further indicator lamp which is proposed comprises a light-emitting element and a full reflection lens disposed atop the light-emitting element, the light-emitting element emitting light to be reflected by the full reflection lens and proceed forwardly of the full reflection lens, the convex lens part being disposed atop the light-emitting element, the convex lens part being formed by charging a transparent polymer material into a frame disposed such as to surround the light-emitting element from above the frame such as to be raised in a convex shape.

The frame is made of a transparent material.

DETAILED DESCRIPTION OF THE PREFERRED EMBODIMENTS

Figure 1:
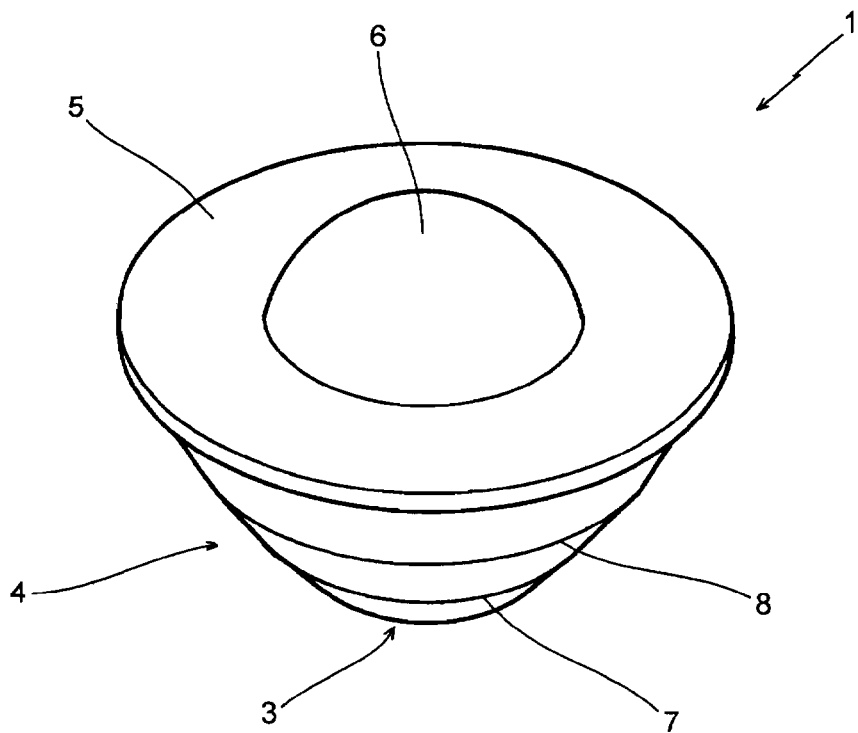
FIG. 1 is a perspective view showing a first embodiment of the indicator lamp according to the invention.
Figure 2:
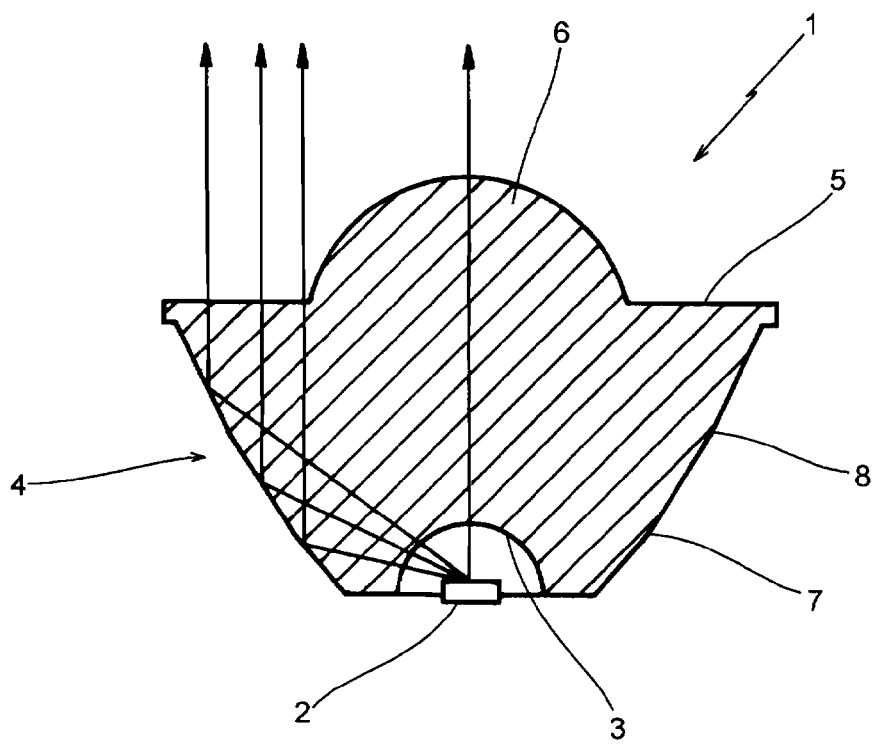
FIG. 2 is a sectional view showing the first embodiment of the indicator lamp according to the invention.

FIGS. 1 and 2 show a first embodiment of the indicator lamp according to the invention. A light-emitting element lens 1 which is obtained by processing a transparent polymer material into a substantially conical shape, has a light-emitting element mounting cavity 3 formed in its bottom for disposing a light-emitting element 2 such as a LED in the cavity. The lens 1 has a sloped peripheral surface 4. The angle of the peripheral surface 4 with respect to the lens axis becomes progressively smaller in three stages from the bottom toward the front of the lens. The lens front surface 5 is flat and has a central forwardly convex lens part 6 (R5.78). The lens front surface 5 is made broader by forming a slightly projecting flange-like edge. As for the three-stage sloped parts of the peripheral surface 4, their angles with respect to the lens axis are set up to 40.61 degrees, 32.19 degrees and 26.87 degrees, respectively, (or may be other angles, of course) from the bottom toward the lens front. The circumferential corners 7 and 8 (points of discontinuity) as boundaries between adjacent ones of the three-stage sloped parts, provide bright concentric emission light fluxes as viewed from the side of the lens front.

Figure 3:
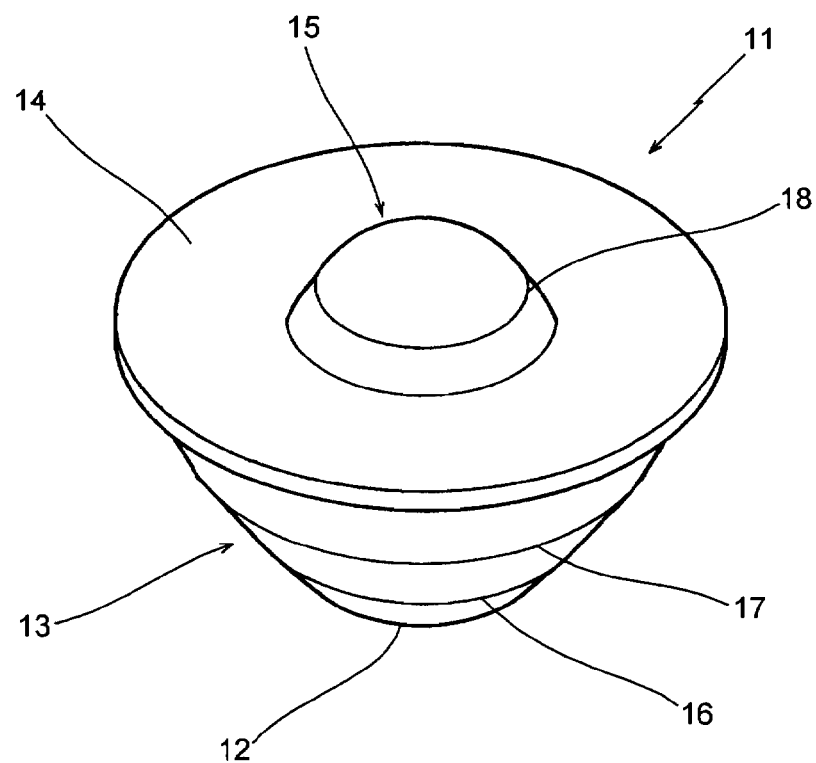
FIG. 3 is a perspective view showing a second embodiment of the indicator lamp according to the invention.
Figure 4:
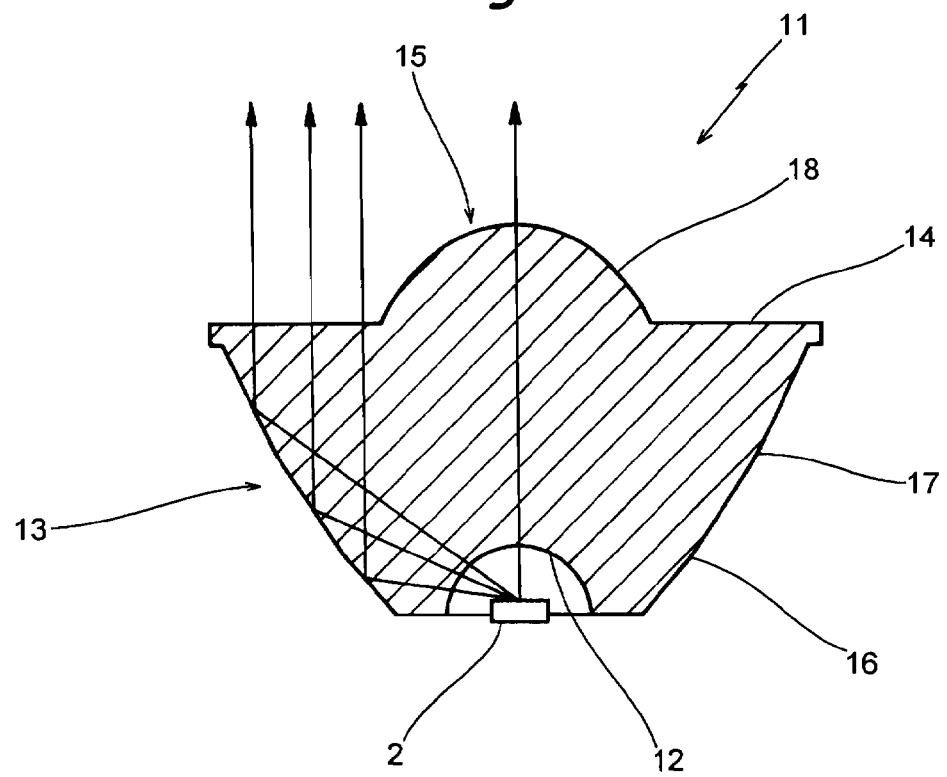
FIG. 4 is a sectional view showing the second embodiment of the indicator lamp according to the invention.

FIGS. 3 and 4 show a second embodiment of the indicator lamp according to the invention. A light-emitting element lens 11 which is obtained by processing a transparent polymer material into a substantially conical shape, has a light-emitting element mounting cavity 12 formed in the bottom for disposing a light-emitting element 2 such as a LED in the cavity. The lens 11 has a sloped peripheral surface 13. The angle of the peripheral surface 13 becomes progressively smaller in three stages from the bottom toward the front of the lens. As for the three-stage sloped parts of the peripheral surface 13 with respect to the lens axis, like those in the previous first embodiment, their angles are set up to 40.61 degrees, 32.19 degrees and 26.87 degrees, respectively, (or may other angles, of course) from the bottom toward the front of the lens. The lens front surface 14 is flat (which is made broader by forming a slightly projecting flange-like edge), and has a central forwardly convex lens part 15 having a smaller diameter than the diameter of the lens front surface 14. The convex lens part 15 has a stem part and a front part with a reduced radius of curvature compared to the stem part. Specifically, the radius of curvature of the stem part is set up to R5.14, and the radius of curvature of the front part is set up to R4.65. The circumferential corners 16 and 17 (points of discontinuity) as boundaries between adjacent ones of the three-stage sloped parts and the radius-of-curvature boundary 18 of the convex lens part 15, provide bright concentric emission light fluxes as viewed from the side of the lens front.

Figure 5:
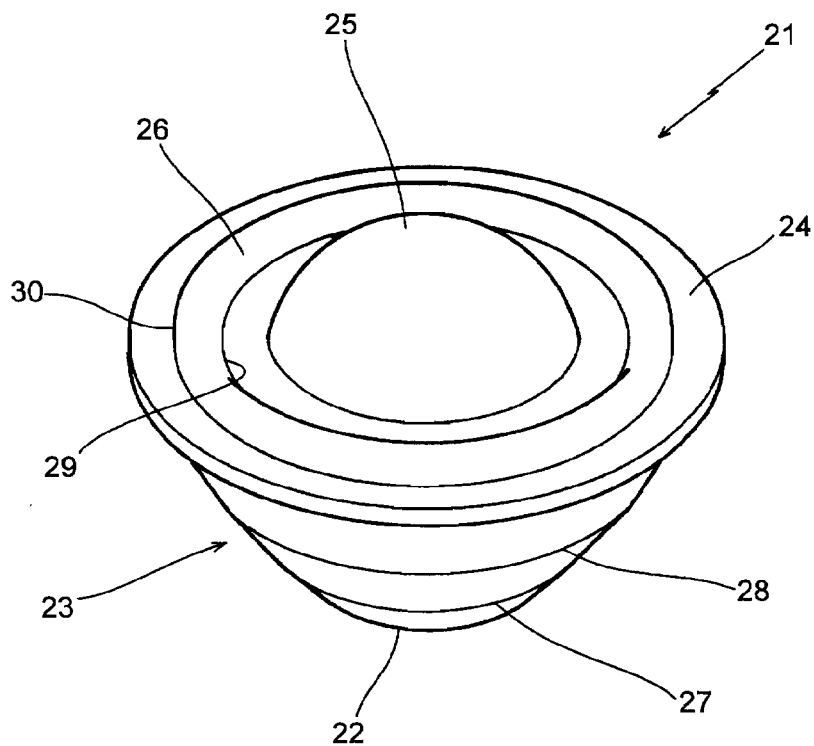
FIG. 5 is a perspective view showing a third embodiment of the indicator lamp according to the invention.
Figure 6:
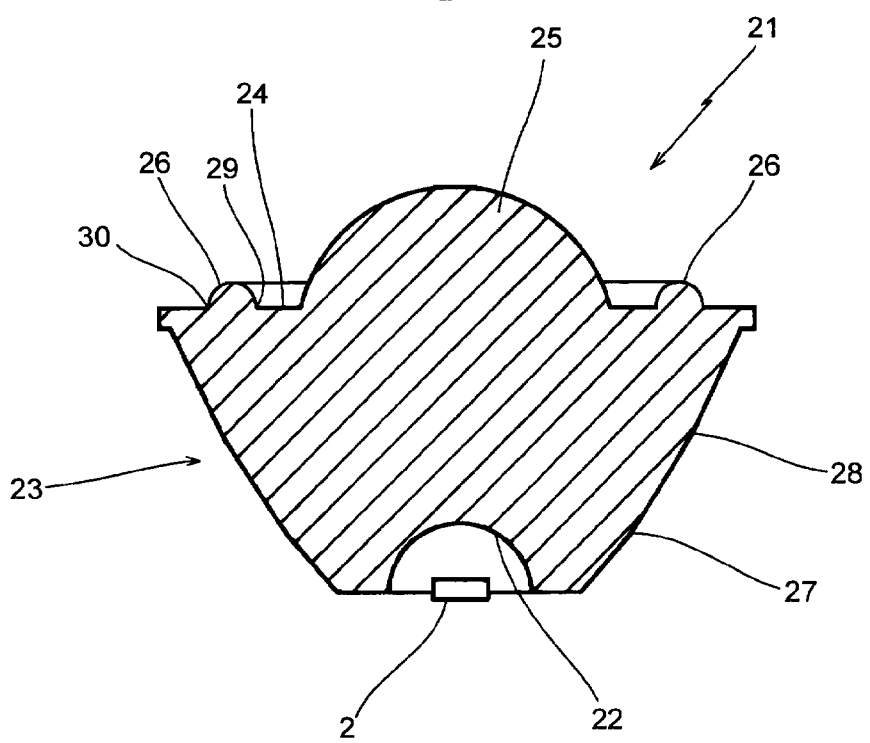
FIG. 6 is a sectional view showing the third embodiment of the indicator lamp according to the invention.

FIGS. 5 and 6 show a third embodiment of the indicator lamp according to the invention. In this embodiment, the light-emitting element lens 21 is a modification of the light-emitting element 1 in the first embodiment. The lens 21 has a light-emitting element mounting cavity 22 formed at the bottom for disposing the light-emitting element 2 such as a LED in the cavity. The peripheral surface 23 of the lens has its slope angle with respect to the lens axis reduced in three stages from the bottom toward the front of the lens. As for the three-stage sloped parts of the peripheral surface 23, their angles with respect to the lens axis are again set up to 40.61 degrees, 32.19 degrees and 26.87 degrees, respectively, (or may be other angles, of coursed) from the bottom toward the front of the lens. The lens front surface 24 is basically flat, but it has a central forwardly convex lens part 25 having a diameter smaller than the diameter of the lens front surface 24, and also, has a ring-like ridge 26 having a semi-circular sectional profile and surrounding the lens part 25. The circumferential boundaries 27 and 28 between adjacent ones of the three-stage sloped parts and the boundaries 29 and 30 of the ridge 26 with respect to the flat part of the lens front surface 24, provide bright concentric emission light fluxes as viewed from the side of the lens front.

In the above embodiments, the peripheral surface of the lens is formed with two circumferential corners as boundaries between adjacent ones of the sloped parts. However, this is by no means limitative; for example, it is possible as well to provide a single corner or three or more corners.

Figure 7:
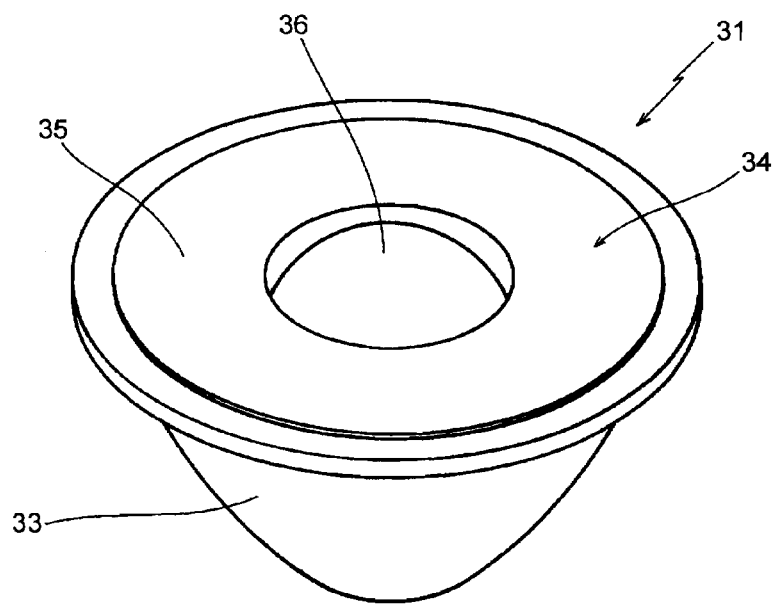
FIG. 7 is a perspective view showing a fourth embodiment of the indicator lamp according to the invention.
Figure 8:
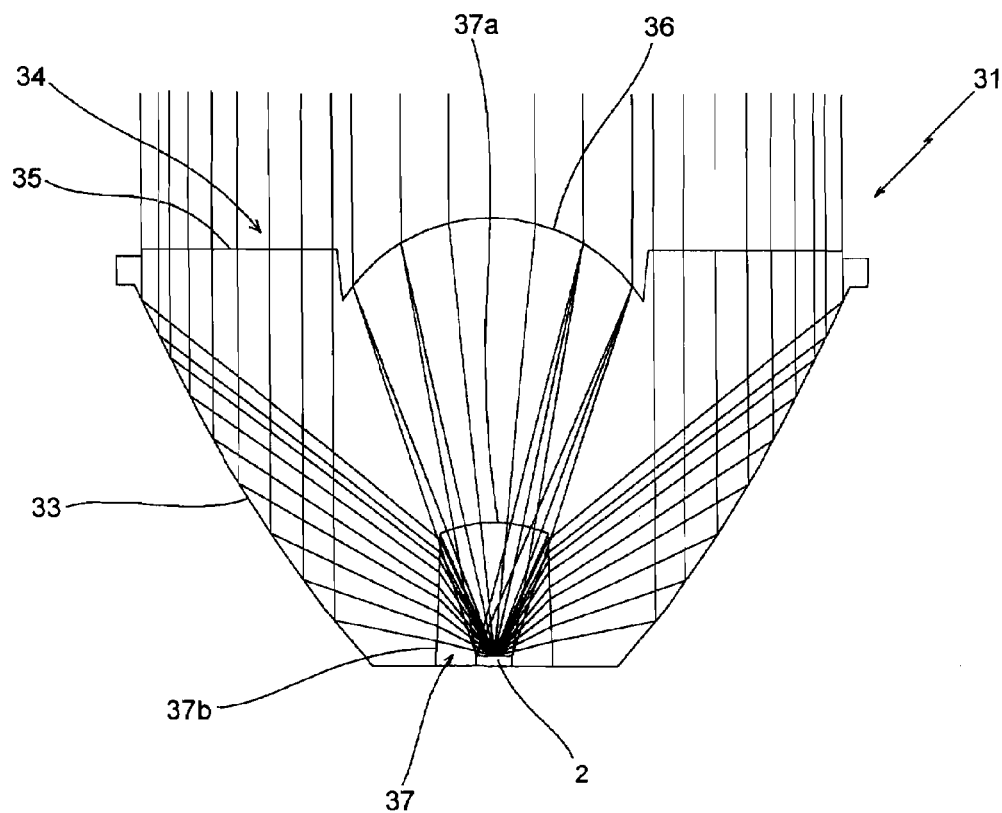
FIG. 8 is a view for describing the optical path in the fourth embodiment of the indicator lamp according to the invention.

FIGS. 7 and 8 show a fourth embodiment of the indicator lamp according to the invention. In this embodiment, the light-emitting element lens 31, which is made of a transparent polymer material such as acrylic resin and has a maximum outer diameter of about 21 mm and a height of about 12.5 mm, has an inverted conical shape with the outer diameter thereof increasing as one goes upwards. The light-emitting element 2 is disposed at the bottom of the lens, and its emitted light is converged and proceeds as a certain degree of emission light flux forwardly of the lens. This light-emitting element lens 31 has a peculiarly curved peripheral surface slightly outwardly swelling from the bottom towards the front surface 34 of the lens (a plurality of slipped surface parts being possible instead of the curved peripheral surface). The lens front surface 34 has an outer flat surface part 35 and a central forwardly convex lens part 36 (R5) forwardly projecting from a position slightly on the rear side of the lens front surface 34.

The light-emitting element 1 has its bottom formed with a substantially cylindrical cavity 37 having a height sufficient enough to dispose the light-emitting element 2 in the cavity. (In the prior art light-emitting element lens described above, the lens bottom is formed with a mere semi-spherical cavity having a small diameter needed to merely dispose the light-emitting element.) The cavity 37 has a spherical front surface 37a (R4), which is convex forwardly of the lens. The cavity 37 also has a slightly tapered peripheral surface 37b with the diameter thereof progressively reduced as one goes from the lens bottom toward the lens front. The cavity 37 thus has a substantially cylindrical shape. The diameter, height and taper of the cavity 37 are set up depending on the dimensions of the disposed light-emitting element 2, the refractive index corresponding to the lens material and the outer lens dimensions, etc.

With the light-emitting element lens 31 having the above structure, as shown in FIG. 8, light emitted from the light-emitting element 2 toward the convex front surface 37a of the cavity, is incident substantially at right angles (below the full reflection angle corresponding to the refractive index of the lens) on the front surface 37a, then proceeds straight through the lens, and is refracted to be converged by the convex lens part 36 of the lens front surface 34 and become an emission light flux proceeding forwardly of the lens. In this embodiment, light passing through the convex lens part 36 is rendered to be a parallel light flux by setting up the radius of curvature of the convex lens part 36 to the refractive index of the acrylic resin lens. Light emitted from the light-emitting element 2 toward the peripheral surface 37b of the cavity 37, is incident at the full reflection angle corresponding to the refractive index of the lens on the peripheral surface 37b to be diffracted, then is incident at angles not below the above full reflection angle to be fully reflected, and then is passed through the flat surface part 35 of the lens front surface 34 to proceed as emission light flux forwardly of the lens.

Figure 9:
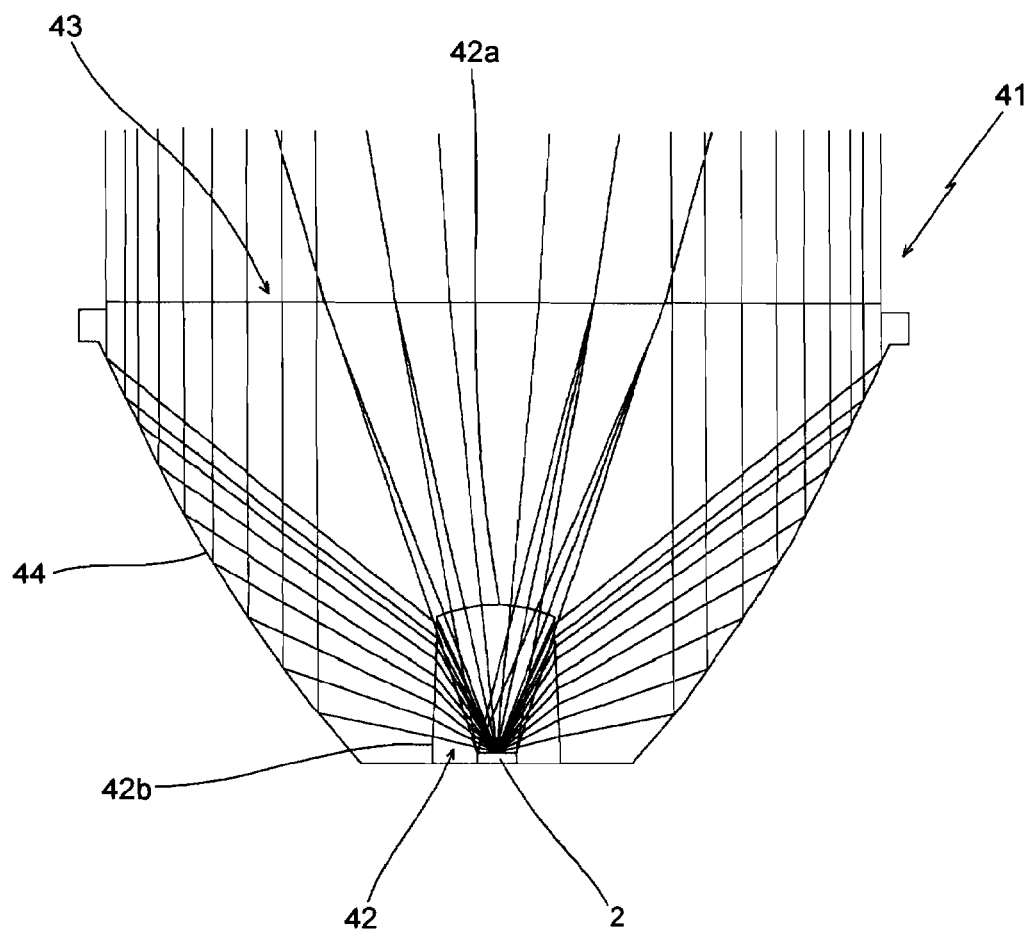
FIG. 9 is a view for describing the optical path in a fifth embodiment of the indicator lamp according to the invention.

FIG. 9 is a view showing a fifth embodiment of the indicator lamp according to the invention. In this embodiment, the light-emitting element lens 41, unlike the lens in the preceding fourth embodiment, has a fully flat front surface free from any convex lens part. For the remainder, this embodiment is the same as the fourth embodiment. With this light-emitting element lens 41, light emitted from the light-emitting element 2 toward the front surface 42a of the cavity 42, is incident substantially at right angles on the front surface 42a, then proceeds as emission light flux through the lens, and is then diffracted by the lens font surface 43 toward the lens axis to become an emission light flux proceeding forwardly of the lens. Light emitted from the light-emitting element 3 toward the peripheral surface 42b of the cavity 42, is incident at angles below the full reflection angle corresponding to the refractive index of the lens on the peripheral surface 42b to be refracted, then is incident at angles not below the full reflection angle on the peripheral surface 44 to be fully reflected, and then proceeds through the lens front surface 43 to become an emission light flux proceeding forwardly of the lens. This lens 41, although not providing a perfectly parallel light flux as in the case of the light-emitting element lens 31 in the fourth embodiment, can provide a converging function to provide a roughly parallel light flux of a simple shape. Although not illustrated, with such an arrangement that light is not caused by the front surface 42a of the cavity 42 to proceed straight but is diffracted for deviation toward the lens axis, it is possible to provide a more suitable converging function to provide light close to a parallel light flux.

Figure 10:
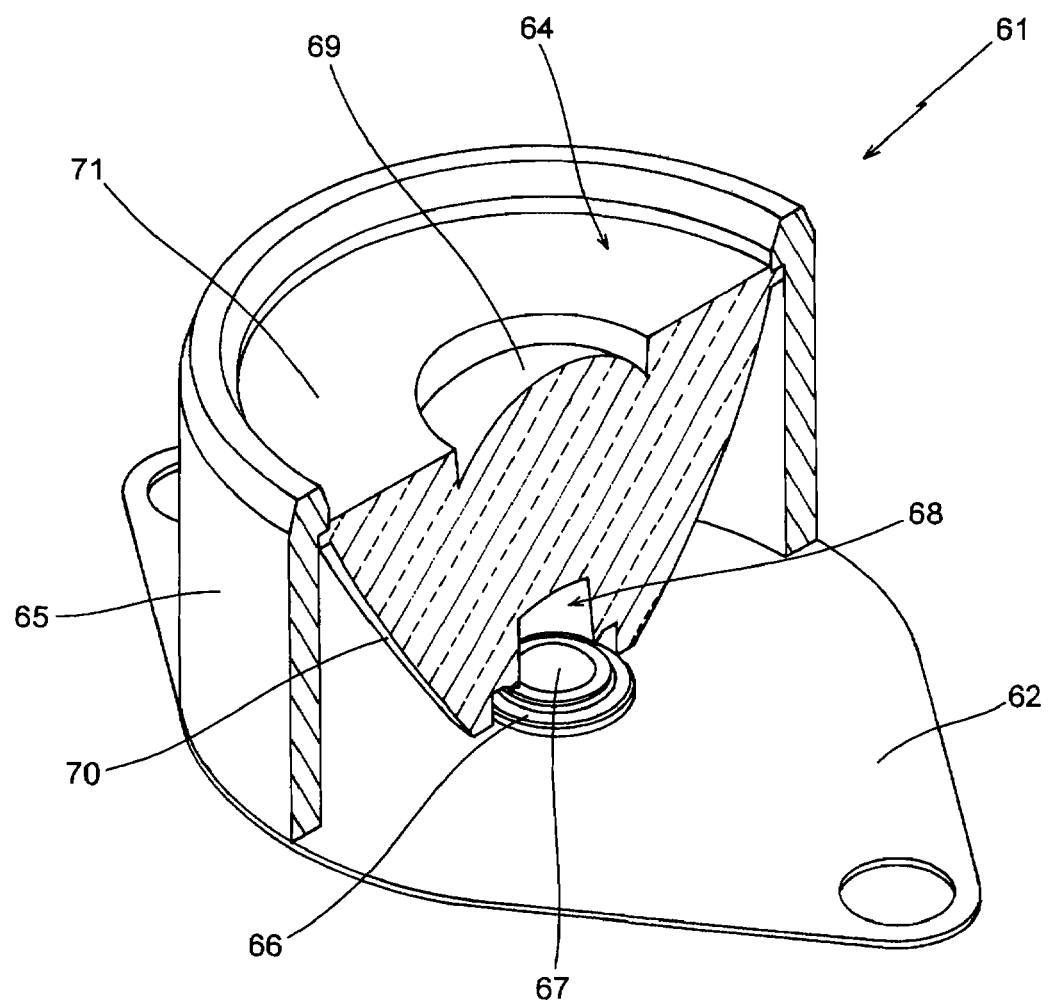
FIG. 10 is a fragmentary sectional view showing a sixth embodiment of the indicator lamp according to the invention.
Figure 11:
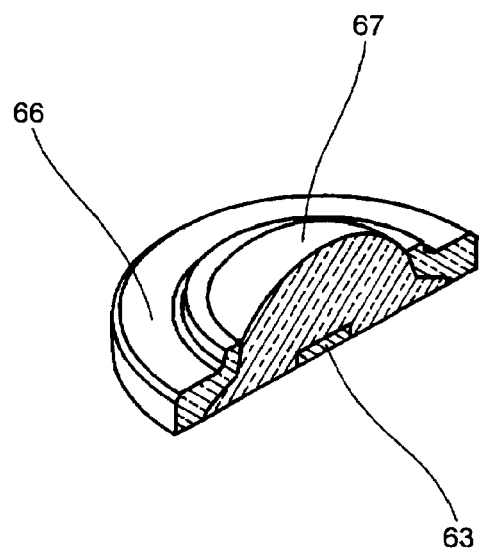
FIG. 11 is a perspective view showing a frame in the sixth embodiment of the indicator lamp according to the invention.
Figure 12:
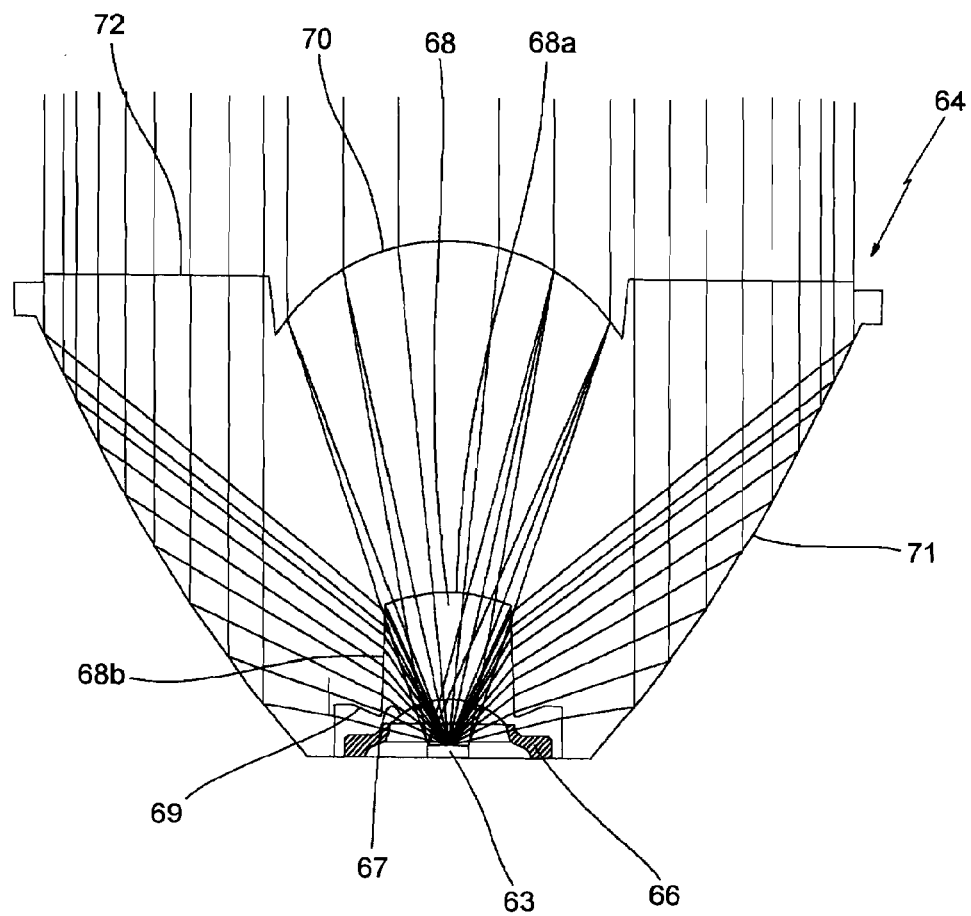
FIG. 12 is a view for describing the optical path in the sixth embodiment of the indicator lamp according to the invention.

FIGS. 10 to 12 show a sixth embodiment of the indicator lamp according to the invention. In this embodiment, the light-emitting element lens 61 is a modification of the light-emitting element lens 31 in the fourth embodiment in view of the disposition of the light-emitting element 2. FIG. 10 shows a half-split structure of the indicator lamp 61. The indicator lamp 61 comprises a light-emitting element 63 such as a LED disposed on a base 62 formed with a wiring pattern, a full reflection lens 64 and a non-transparent cylindrical cover 65. The full reflection lens 64 is disposed atop the light-emitting element 63, is made of a transparent polymer material such as an acrylic resin, and has a substantially inverse conical shape with the diameter thereof progressively increasing as one goes forwards and having a maximum outer diameter of about 21 mm and a height of about 12.5 mm. The cylindrical cover 65 is disposed on the base 62 so as to surround the peripheral surface of the full reflection lens 64 while holding a front part thereof.

FIG. 11 is a half-split perspective view showing the lens structure in the neighborhood of the light-emitting element 63. A substantially ring-like frame 66 made of a transparent acrylic resin surrounds the small diameter light-emitting element 63 disposed on the base 62. Transparent molten silicone or like polymer material is charged down into the frame such as to cover the light-emitting element 63 and also be swelled to a convex shape by the surface tension, and is hardened, thus forming a convex lens part 67. The frame 66 serves as a die for charging molten polymer material into it, and is transparent in it to transmit light from the light-emitting element 63 without leakage. The convex lens part 67 has a function of converging light emitted from the light-emitting element to a certain extent and also a function of protecting the light-emitting element 63 and bonding wires (not shown) connecting the light-emitting element 63 and patterns on the base 62. It is possible to obtain a desired radius of curvature of the convex lens part 67 by controlling the quantity of the polymer material charged into the frame 66 to a constant quantity. In the prior art, the light-emitting element and the bonding wires were coated with silicon warmish by using a brush. In this method, the light emitted from the light-emitting element and reaching the lens body is non-uniform, and consequently it was impossible to obtain suitable converging such as parallel light flux. The resin part covering the light-emitting element 63 is made to be large in diameter, and the diameter of the cavity 68 is correspondingly made to be large. However, making the diameter of the cavity 68 large as a whole has great adverse effects on the optical path of light reflected by the lens peripheral surface. To avoid this, a least necessary structure size is set up. Also, the cavity 68 is formed with a stepped extension surface 69 in a bottom part to increase the diameter thereof alone without changing the size of the remainder, i.e., the front part. However, by forming the stepped extension surface 69 simply as a horizontal surface, light emitted from the light-emitting element 63 is diffracted by the stepped extension surface 69 to provide unintended optical path different from the optical path in the fourth embodiment. The stepped extension surface 69 is made to be an outwardly upward taper lest light emitted from the light-emitting element 63 should be incident on the stepped extension 69.

In the indicator lamp 61 having the above structure, as shown in FIG. 12, light emitted from the light-emitting element 63 is converged to a certain extent as it is transmitted through the convex lens part 67 covering the light-emitting element, and then proceeds through the cavity 68. Light directed from the convex lens part 67 toward the front surface 68a of the cavity 68 is incident on the curved front surface 68a substantially at right angles (below the full reflection angle corresponding to the radius of curvature of the lens), proceeds through the lens body straight, and is diffracted to be converged by the central convex lens part 70 of the lens front surface and become an emission light flex proceeding forwardly of the lens. In this embodiment, light passing through the convex lens part 67 is made to be a parallel light flux by setting up the radius of curvature of the convex lens part 67 according to the diffractive index of the acrylic resin lens. Light directed from the convex lens part 67 toward the peripheral surface 68b of the cavity 68, is incident at angles below the full reflection angle corresponding to the refractive index of the lens on the peripheral surface 68b to be diffracted, then is incident at angles not below the above full reflection angle on the peripheral surface 71 to be fully reflected, and then proceeds through the flat surface part 72 of the lens front surface to become an emission light flux proceeding forwardly of the lens.

While the above embodiment is concerned with the structure that the central convex lens part 70 is provided on the front surface of the full reflection lens 64, this is by no means limitative; for instance, the lens front surface may be made fully flat and free from any central convex lens part. Even in this case, although not a perfect parallel light flux as in the case of the fifth embodiment of the indicator lamp 61 described above, this embodiment of the indicator lamp can provide a converging function to provide a roughly parallel light flux of a simple shape. Although not illustrated, with such an arrangement that light is not caused by the front surface 68a of the cavity 68 to proceed straight but diffracted for deviation toward the lens axis, it is possible to provide a more suitable converging function to provide light close to a parallel light flux.

POSSIBILITY OF INDUSTRIAL UTILIZATION

In the indicator lamp according to the invention, the light-emitting element lens is constituted by a light-emitting element mounting cavity, the light-emitting element being mounted therein, the lens body having an inverted conical shape peripheral surface for fully reflecting and forwardly re-directing light emitted from the light-emitting element, the peripheral surface having varying angles with respect to the lens axis from the bottom toward the front of the lens, thereby forming one or more circumferential corners, which scatter light emitted from the light-emitting element forwardly to provide concentric emission light fluxes as viewed from the lens front side. Thus, a planar light flux resulting from full reflection by the peripheral surface and concentric ring-like light fluxes brighter than the planar light flux are combined together to form resultant light emitted from the front surface of the lens. It is thus possible to obtain excellent visual recognition property not only in the short distance but also in the long distance owing to the ring-like light fluxes.

The lens body has a convex lens part projecting from the center of the lens front. Thus, light which is not reflected by the lens body peripheral surface but is directly transmitted through the central part of the lens, is converged by the convex lens part, thus permitting more suppression of scattering and light emission up to a more remote place. Also, at the boundary between the lens front surface and the convex lens part, light emitted from the light-emitting element is collected more than it is collected at the other lens front part to form a bright ring-like light flux emitted from the lens front. It is thus possible to improve the visual recognition property not only in the short distance but also in the long distance.

The lens body has a convex lens part projecting from the center of the lens and also has an annular ridge of a semicircular sectional profile also projecting from the lens front such as to surround the convex lens part. Thus, light which is neither reflected by the lens body peripheral surface nor transmitted through the convex lens part but is merely transmitted through the convex lens part outer periphery, is further converged by the above ridge, thus permitting more suppression of scattering and light emission up to a more remote place. Double concentric boundaries between the lens front surface and the ridge, collect more light emitted from the light-emitting element than the other part of the lens front to provide bright ring-like light fluxes emitted from the lens front. It is thus possible to further improve the visual recognition property not only in the short distance but also in the long distance.

Furthermore, according to the invention the indicator lamp comprises a light-emitting element and a lens body with the diameter thereof increasing as one goes forwards, the light-emitting element being disposed at the bottom of the lens body and emitting light to be fully reflected by the peripheral surface of the lens body and proceed forwardly thereof, the lens body being formed at the bottom thereof with a substantially cylindrical cavity accommodating the light-emitting element, light emitted from the light-emitting element such as to be directed toward the peripheral surface of the cavity being incident on the lens body at angles less than the full reflection angle corresponding to the reference index of the lens body passing through the lens, and being incident on he peripheral surface of the lens body to be fully reflected and proceed forwardly of the lens body, light emitted from the light-emitting element such as to be directed toward the surface of the cavity being incident on the lens body at angles less than the full reflection angle and passing through the lens body to directly proceed forwardly of the lens body. Thus, light emitted from the light-emitting element is split into a light flux passing through the front surface of the cavity and a light flux passing through the peripheral surface, and the light flux passing through the peripheral surface of the cavity is suitably fully reflected by the lens body peripheral surface according to the radius of curvature of the lens body, and suitably proceed as an emission light flux forwardly of the lens body.

The front center of the lens body has a convex lens part projecting forwardly of the lens body and also a flat surface part extending around the convex lens part, light emitted from the light-emitting element such as to be directed toward the front surface of the cavity being incident on the lens body at angles less than the full reflection angle of the lens body, passing through the lens body and being converted by the convex lens part to proceed forwardly of the lens body, light emitted from the light-emitting element such as to be directed toward the peripheral surface of the cavity being incident on the lens at angles less than the full reflection angle of the lens body to be fully reflected and proceed forwardly from the flat surface part. Thus, light passing through the front surface of the cavity is collected in the convex lens part, and light passing through the peripheral surface of the cavity is fully reflected by the lens body peripheral surface to be emitted as a suitable emission light flux forwardly of the lens body.

Moreover, according to the invention the indicator lamp comprises a light-emitting element and a full reflection lens disposed atop the light-emitting element, the light-emitting element emitting light to be reflected by the full reflection lens and proceed forwardly of the full reflection lens, the convex lens part being disposed atop the light-emitting element, the convex lens part being formed by charging a transparent polymer material into a frame disposed such as to surround the light-emitting element from above the frame such as to be raised in a convex shape. Thus, the light-emitting element and bonding wires connected thereto are protected by the transparent polymer material. Also, light emitted from the light-emitting element is collected by swelling convex lens part to become a suitable emission light flux proceeding toward the full reflection lens. It is thus possible that light emitted from the light-emitting element can smoothly and efficiently proceed as mission light flux forwardly of the full reflection lens.

With the frame made of a transparent material, light emitted from the light-emitting element toward the frame can proceed toward the full reflection lens without being blocked by the frame. Thus, it is possible to obtain efficient light emission.

What is claimed is:

1. An indicator lamp comprising:
a light-emitting element; and
a light-emitting element lens, wherein said light-emitting element lens includes a lens body having a light-emitting element mounting cavity formed at a rear of said lens body, said light-emitting element being mounted in said light-emitting element mounting cavity, said lens body having an inverted conically shaped peripheral surface for fully reflecting and forwardly re-directing light emitted from said light-emitting element, said peripheral surface having three linearly sloped sections, each of said sloped sections being sloped relative to an axis of said light-emitting element lens at an angle different from that of the other sloped sections so as to define circumferential corners at points of discontinuity between adjacent ones of said three linearly sloped sections, wherein said circumferential corners are arranged so as to scatter light emitted from said light-emitting element forwardly to provide concentric emission light fluxes as viewed from a side of said front surface of said light-emitting element lens.

2. The indicator lamp according to claim 1, wherein said lens body includes a convex lens portion projecting outwardly from a center of said front surface of said light-emitting element lens.

3. The indicator lamp according to claim 2, wherein said convex lens portion has a diameter less than that of said front surface of said light-emitting element lens.

4. The indicator lamp according to claim 1, wherein said lens body includes a convex lens portion projecting outwardly from a center of said front surface of said light-emitting element lens, and wherein said lens body has an annular ridge of a semi-circular sectional profile projecting outwardly from said front surface of said light-emitting element lens so as to surround said convex lens portion.

5. An indicator lamp comprising:
a light-emitting element; and
a lens body having a diameter which increases as distance from said light-emitting element increases in a forward direction, said light-emitting element being disposed at a rear of said lens body and emitting light to be fully reflected by a peripheral surface of said lens body and to proceed forwardly thereof, said peripheral surface having three linearly sloped sections, each of said sloped sections being sloped relative to an axis of said lens body at an angle different from that of the other sloped sections so as to define circumferential comets at points of discontinuity between adjacent ones of said three linearly sloped sections, said lens body having a substantially cylindrical cavity formed at the rear of said lens body so as to accommodate said light-emitting element, light emitted from said light-emitting element so as to be directed toward a peripheral surface of said cavity being incident on said lens body at angles less than a full reflection angle corresponding to a refractive index of said lens body, passing through said lens body, and being incident on the peripheral surface of said lens body to be fully reflected and proceed forwardly of said lens body, light emitted from said light-emitting element so as to be directed toward a front surface of said cavity being incident on said lens body at angles less than said full reflection angle and passing through said lens body to directly proceed forwardly of said lens body.

6. The indicator lamp according to claim 5, wherein a front surface of said lens body has a convex lens portion projecting outwardly from said lens body and also has a flat surface part extending around said convex lens portion, light emitted from said light-emitting element so as to be directed toward the front surface of said cavity being incident on said lens body at angles less than the full reflection angle of said lens body, passing through said lens body and being converged by said convex lens portion to proceed forwardly of said lens body, light emitted from said light-emitting element so as to be directed toward the peripheral surface of said cavity being incident on said lens body at angles less than the full reflection angle of said lens body to be fully reflected and proceed forwardly from said flat surface portion.

* * * * *